United States Patent
O et al.

(10) Patent No.: US 7,626,254 B2
(45) Date of Patent: Dec. 1, 2009

(54) SEMICONDUCTOR PACKAGE USING CHIP-EMBEDDED INTERPOSER SUBSTRATE

(75) Inventors: Min-Ho O, Daegu (KR); Jong-Ho Lee, Chungcheongnam-do (KR); Eun-Chul Ahn, Gyeonggi-do (KR); Pyoung-Wan Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/121,490

(22) Filed: May 15, 2008

(65) Prior Publication Data

US 2008/0283996 A1 Nov. 20, 2008

(30) Foreign Application Priority Data

May 15, 2007 (KR) .................. 10-2007-0047293

(51) Int. Cl.
*H01L 23/48* (2006.01)
(52) U.S. Cl. .................. 257/686; 257/E23.018
(58) Field of Classification Search .......... 257/734, 257/686, 777, E23.188
See application file for complete search history.

(56) References Cited

U.S. PATENT DOCUMENTS

| 5,703,400 | A * | 12/1997 | Wojnarowski et al. ...... 257/723 |
| 6,949,818 | B2 * | 9/2005 | Park .......................... 257/686 |
| 7,053,476 | B2 * | 5/2006 | Karnezos ................... 257/686 |
| 7,224,054 | B2 * | 5/2007 | Shibata ...................... 257/684 |
| 2002/0066952 | A1 * | 6/2002 | Taniguchi et al. .......... 257/698 |
| 2007/0035004 | A1 * | 2/2007 | Konishi et al. ............. 257/686 |
| 2007/0228544 | A1 * | 10/2007 | Jung et al. ................. 257/686 |

FOREIGN PATENT DOCUMENTS

| JP | 2000-294720 | 10/2000 |
| JP | 2002-158312 | 5/2002 |
| KR | 2000-0011420 | 7/2000 |

OTHER PUBLICATIONS

English language abstract of Korean Publication No. 2000-0011420.
English language abstract of Japanese Publication No. 2000-294720.
English language abstract of Japanese Publication No. 2002-158312.

* cited by examiner

*Primary Examiner*—Nathan W Ha
(74) *Attorney, Agent, or Firm*—Volentine & Whitt, PLLC

(57) ABSTRACT

A semiconductor package using a chip-embedded interposer substrate is provided. The chip-embedded interposer substrate includes a chip including a plurality of chip pads; a substrate having the chip mounted thereon and including a plurality of redistribution pads for redistributing the chip pads; bonding wires for connecting the chip pads to the redistribution pads; a protective layer having via holes for exposing the redistribution pads while burying the chip and the substrate; and vias connected to the redistribution pads through the via holes. The semiconductor package including chips of various sizes is fabricated using the chip-embedded interposer substrate.

8 Claims, 6 Drawing Sheets

SEMICONDUCTOR PACKAGE USING CHIP-EMBEDDED INTERPOSER SUBSTRATE

CROSS-REFERENCE TO RELATED PATENT APPLICATION

This application claims the benefit of Korean Patent Application No. 10-2007-0047293, filed on May 15, 2007, in the Korean Intellectual Property Office, the disclosure of which is incorporated herein in its entirety by reference.

BACKGROUND OF THE INVENTION

1. Field of the Invention

The present invention relates to a semiconductor package, and more particularly, to a semiconductor package using a chip-embedded interposer substrate.

2. Description of the Related Art

With the advent of the digital information age, multimedia products, electrical home appliances, personal digital products and the like have been rapidly developed. These products generally require characteristics of small size, high performance, multiple functions, high speed, large capacity, low price, and the like. Accordingly, a stacked package or system in package, in which a plurality of chips are stacked in parallel or vertically on top of one another in a single semiconductor package, has been developed.

A stacked package or system in package includes a plurality of chips assembled in a single package, and has advantages in that electrical performance can be enhanced, the size of the package can be reduced, and fabrication costs can be reduced. However, since the pitch of chip pads is small in stacked packages or system in packages, connection between chip pads and interconnection pads of an interconnection substrate is difficult.

To solve such a problem, a multi-layered interconnection substrate or additional interposer chip for connection between chip pads and interconnection pads of an interconnection substrate is used in stacked packages or system in package. That is, in a conventional stacked package or system in package, a redistribution layer is formed in a multi-layered interconnection substrate or additional interposer chip, and chip pads are then connected to interconnection pads of an interconnection substrate using the redistribution layer.

However, since redistribution is performed using the multi-layered interconnection substrate or additional interposer chip in the conventional stacked package or system in package, packaging cost is increased, and a packaging process for connection between chip pads and interconnection pads of an interconnection substrate is very complicated.

SUMMARY OF THE INVENTION

The present invention provides a chip-embedded interposer substrate capable of facilitating connection between a chip and a substrate, and reducing packaging cost.

The present invention also provides a semiconductor package that can be easily packaged using the aforementioned chip-embedded interposer substrate.

The present invention also provides a stacked semiconductor package, wherein a plurality of chips are stacked together using the aforementioned chip-embedded interposer substrate.

According to an aspect of the present invention, there is provided a chip-embedded interposer substrate. The chip-embedded interposer substrate includes a chip including a plurality of chip pads; a substrate having the chip mounted thereon and including a plurality of redistribution pads for redistributing the chip pads; and bonding wires for connecting some of the chip pads to the redistribution pads. The pitch of the redistribution pads may be greater than that of the chip pads.

The chip-embedded interposer substrate includes a protective layer having via holes for exposing the redistribution pads while burying the chip and the substrate, and vias connected to the redistribution pads through the via holes. The vias may be formed on both sidewalls of the via holes, the redistribution pads and a surface of the protective layer. The vias may be interconnections for connecting the redistribution pads for redistributing the chip pads to chip pads of a second external chip. The chip-embedded interposer substrate may further include a via hole for a chip pad, for exposing the chip pad, formed in the protective layer, and a via for a chip pad, connected to the chip pad, further formed in the via hole for a chip pad. The chip may be mounted in a cavity formed in the substrate.

According to another aspect of the present invention, there is provided a chip-embedded interposer substrate. The chip-embedded interposer substrate includes a substrate having a chip mounted thereon and including a plurality of redistribution pads for redistributing a plurality of chip pads, and bonding wires for connecting some of the chip pads to the redistribution pads such that the chip pads are redistributed. Preferably, the pitch of the redistribution pads may be greater than that of the chip pads.

The chip-embedded interposer substrate includes a protective layer formed to bury the chip and the substrate, and having via holes for exposing the redistribution pads, and vias connected to the redistribution pads through the via holes and connected to chip pads of a second external chip. The chip-embedded interposer substrate may further include a via hole for a chip pad, for exposing the chip pad, formed in the protective layer, and a via for a chip pad, connected to the chip pad, further formed in the via hole for a chip pad. The chip may be mounted in a cavity formed in the substrate.

According to another aspect of the present invention, there is provided a semiconductor package. The semiconductor package includes an embedded chip including a plurality of embedded chip pads; a substrate having the embedded chip mounted thereon and including a plurality of redistribution pads for redistributing the embedded chip pads; and bonding wires for connecting some of the embedded chip pads to the redistribution pads. Preferably, the pitch of the redistribution pads may be greater than that of the embedded chip pads. The embedded chip may be mounted in a cavity formed in the substrate.

The semiconductor package includes a protective layer formed to bury the embedded chip and the substrate, and having via holes for exposing the redistribution pads; vias connected to the redistribution pads through the via holes; and external connection terminals connected to the vias. The vias may be formed on both sidewalls of the via holes, the redistribution pads and a surface of the protective layer.

According to another aspect of the present invention, there is provided a semiconductor package. The semiconductor package includes a substrate having an embedded chip mounted thereon and including a plurality of redistribution pads for redistributing a plurality of embedded chip pads, and bonding wires for connecting some of the embedded chip pads to the redistribution pads such that the embedded chip pads are redistributed. Preferably, the pitch of the redistribution pads may be greater than that of the embedded chip pads. The embedded chip may be mounted in a cavity formed in the substrate.

The semiconductor package includes a protective layer formed to bury the embedded chip and the substrate, and having via holes for exposing the redistribution pads; vias connected to the redistribution pads through the via holes; and external connection terminals connected to the vias.

According to another aspect of the present invention, there is provided a semiconductor package. The semiconductor package includes an embedded chip including a plurality of embedded chip pads; a substrate having the embedded chip mounted thereon and including a plurality of redistribution pads for redistributing the embedded chip pads; and first bonding wires for connecting the embedded chip pads to the redistribution pads. Preferably, the pitch of the redistribution pads may be greater than that of the embedded chip pads. The embedded chip may be mounted in a cavity formed in the substrate. The first bonding wires may connect some of the embedded chip pads to the redistribution pads.

The semiconductor package includes a first protective layer formed to bury the embedded chip and the substrate, and having a first via holes for exposing the redistribution pads; first vias connected to the redistribution pads through the first via holes; a first chip mounted on the first protective layer and including a plurality of first chip pads; and second bonding wires for connecting the first chip pads to the first vias. The first vias may be interconnections for connecting the redistribution pads for redistributing the embedded chip pads to the first chip pads of the first chip.

The semiconductor package includes a second protective layer formed to entirely bury the embedded chip and the first chip, and having second via holes for exposing the first vias; second vias connected to the first vias through the second via holes; and external connection terminals connected to the second vias. The second vias may be formed on both sidewalls of the second via holes, the first vias and a surface of the second protective layer.

The semiconductor package may further include a second chip mounted on the first chip and including a plurality of second chip pads, and third bonding wires for connecting the second chip pads to the first vias.

In a chip-embedded interposer substrate of the present invention configured as described above, a chip is embedded in the chip-embedded interposer substrate, and redistribution is performed using a wire bonding process. A semiconductor package having chips with various sizes can be simply fabricated using such a chip-embedded interposer substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
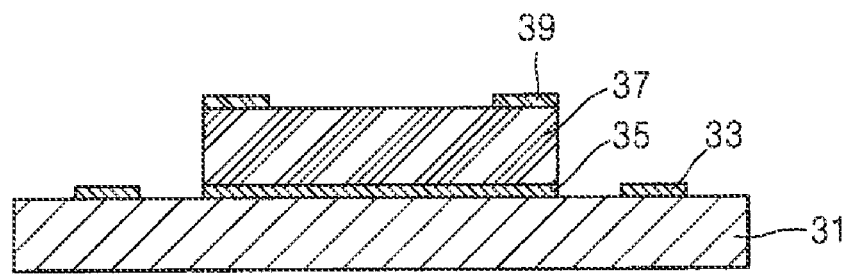
FIGS. 1 through 4 are cross-sectional views illustrating the structure and fabrication method of a chip-embedded interposer substrate according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers, films and regions are exaggerated for clarity. Like numbers refer to like elements throughout the specification.

Chip-Embedded Interposer Substrate

Figure 3:
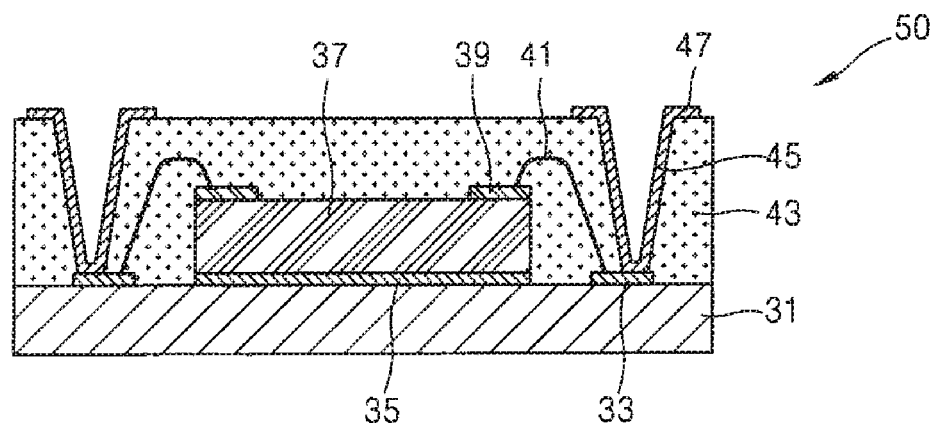
Figure 4:
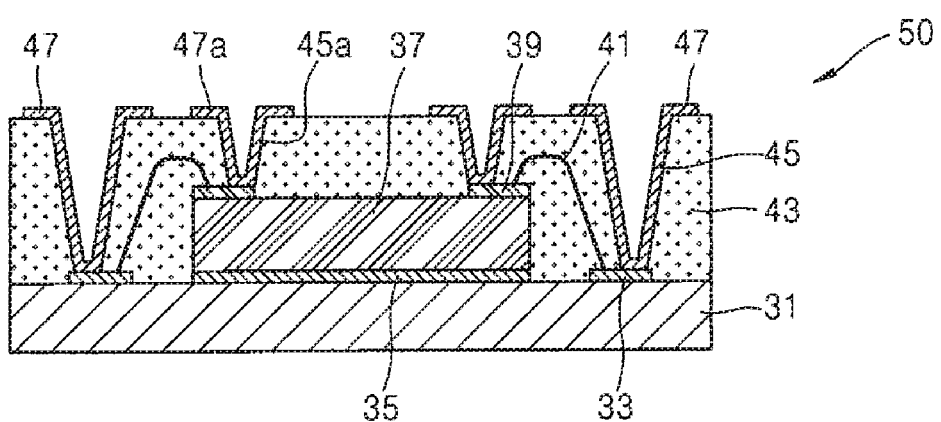
Figure 5:
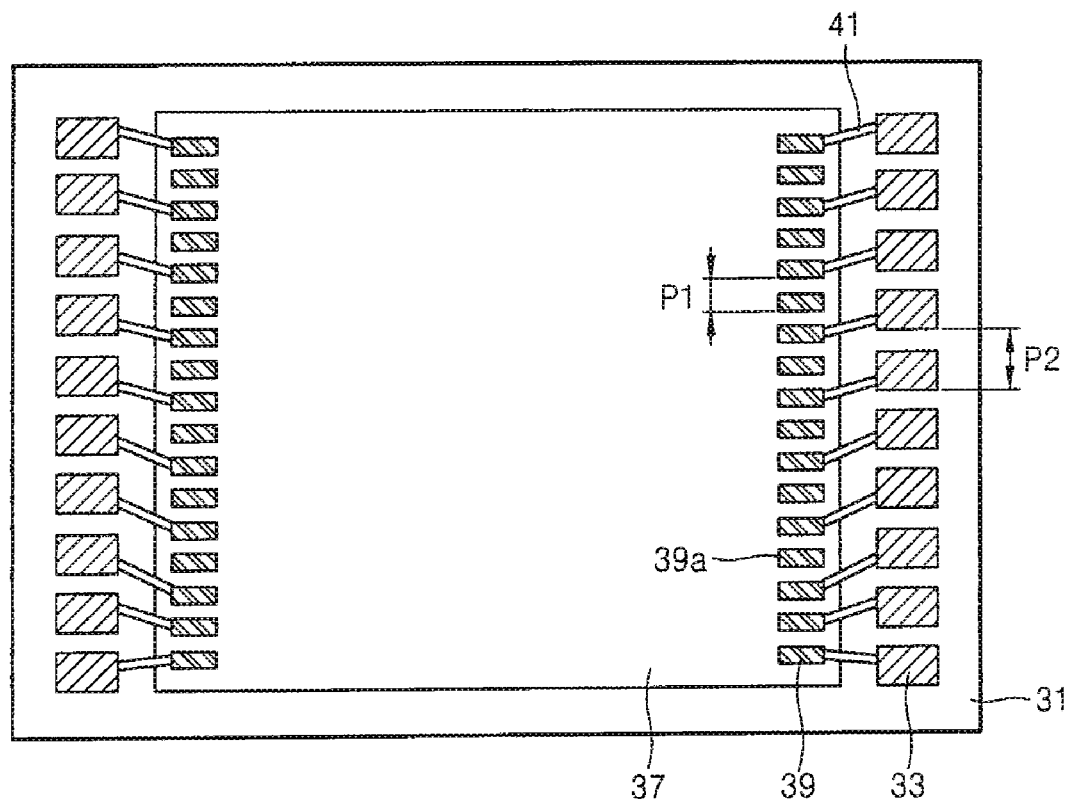
FIG. 5 is a plan view of the chip-embedded interposer substrate according to an embodiment of the present invention.

FIGS. 1 through 4 are cross-sectional views illustrating the structure and fabrication method of a chip-embedded interposer substrate according to an embodiment of the present invention, and FIG. 5 is a plan view of the chip-embedded interposer substrate according to an embodiment of the present invention.

Referring to FIGS. 1 and 5, an adhesive layer 35 is formed on a substrate 31, and a chip 37 is mounted on the adhesive layer 35. The chip 37 has a plurality of chip pads 39. The chip 37 may include various chips such as a memory chip, a non-memory chip, a logic chip and an analog chip. The chip pads 39 are input/output pads capable of inputting/outputting electric signals to the chip 37. When the chip 37 is a highly integrated chip, the pitch P1 of the chip pads 39 is relatively small.

The substrate 31 includes a plurality of redistribution pads 33 for redistributing the chip pads 39. The substrate 31 is unnecessary to be an interconnection substrate having interconnections. The substrate 31 may be a polymer substrate or printed circuit board (PCB). Since the redistribution pads 33 formed on the substrate 31 perform only the function of redistributing the chip pads 39, the redistribution pads 33 are formed to be larger than the chip pads 39. Accordingly, the pitch P2 of the redistribution pads 33 is greater than the pitch P1 of the chip pads 39. For example, the pitch P2 of the redistribution pads 33 may be in the order of a few hundreds of µm, and the pitch P1 of the chip pads 39 may be in the order of a few tens of µm.

Figure 2:
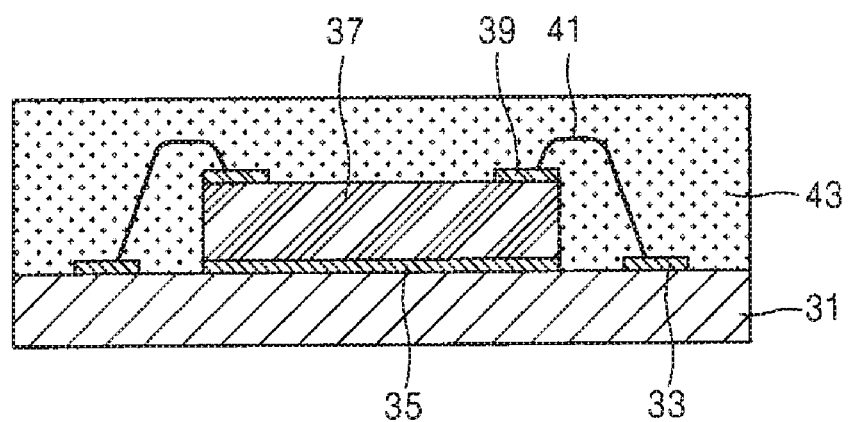

Referring to FIGS. 2 and 5, the chip pads 39 and the redistribution pads 33 are connected through bonding wires 41 using a wire bonding process. However, only some of the chip pads 39 and the redistribution pads 33 are connected through the bonding wires 41 as illustrated in FIG. 5. For example, even- or odd-numbered chip pads 39 of the plurality of chip pads 39 arranged on the chip 37 may be connected to the redistribution pads 33 through the bonding wires 41. Since the chip pads 39 having the relatively small pitch P1 are connected to the redistribution pads 33 having the pitch P2 greater than the pitch P1, the chip pads 39 can be easily connected to the redistribution pads 33 using a wire bonding process.

Subsequently, a protective layer 43 is formed to cover the chip 37 and the substrate 31. The protective layer 43 is formed to sufficiently bury the bonding wires 41 and the substrate 31.

Thus, the chip 37 is embedded in the protective layer 43. The protective layer 43 may be formed of a resin material.

Referring to FIGS. 3 through 5, via holes 45 and 45a for exposing the redistribution pads 33 and/or the chip pads 39 are formed by etching the protective layer 43. A via hole 45 or 45a for exposing any one of the redistribution pads 33 and the chip pads 39 is formed if necessary. In the case of a chip pad (39a of FIG. 5) which is not connected to one of the redistribution pads 33, a via hole 45a for exposing the chip pad 39a may be formed as illustrated in FIG. 4. Thus, reference numeral 45a denotes a via hole for the chip pads 39 and 39a, and reference numeral 45 denotes a via hole for the redistribution pads 33.

Subsequently, vias 47 and 47a are formed in the via holes 45 and 45a, respectively. The vias 47 and 47a may be formed by coating and patterning a metallic material such as copper, gold or tungsten. The vias 47 and 47a are formed on both sidewalls of the via holes 45 and 45a, the chip pads 39 and 39a, the redistribution pads 33 and a surface of the protective layer 43. The vias 47 and 47a are connected to the chip pads 39 or the redistribution pads 33 through the via holes 45 and 45a. The vias 47a for the chip pads 39 and 39a the may be connected to an external connection terminal (not shown) in a subsequent packaging process. The vias 47 for the redistribution pads 33 may be connected to the redistribution pads 33 through the via holes 45.

The manufacture of a chip embedded interposer substrate 50 is completed using the aforementioned fabrication process. The chip embedded interposer substrate 50 includes the chip 37 embedded therein. That is, the chip 37 is an embedded chip. The chip embedded interposer substrate 50 may be manufactured in large quantities as a finished product.

The chip embedded interposer substrate 50 according to the current embodiment of the present invention includes a plurality of redistribution pads for redistributing a plurality of chip pads on a chip mounted on the top surface of a substrate. In the chip embedded interposer substrate 50 according to the current embodiment, the redistribution pads 33 are formed on the substrate 31 to have the relatively large pitch P2, and the vias 47 connected to the redistribution pads 33 having the relatively large pitch P2 are also formed to have a relatively large pitch.

Accordingly, in the chip embedded interposer substrate 50 according to the current embodiment, the chip pads 39 having the pitch P1 smaller than the pitch P2 can be easily connected to the redistribution pads 33 having the pitch P2 using a wire bonding process. Consequently, in the chip embedded interposer substrate 50 according to the current embodiment, the chip 37 can be simply connected to the substrate 31, thus reducing packaging costs.

Moreover, since redistribution is performed using the redistribution pads 33 and the bonding wires 41 in the chip embedded interposer substrate 50 according to the current embodiment, a plurality of chips can be easily stacked together regardless of various sizes or shapes of the chips as will be described later.

Figure 6:
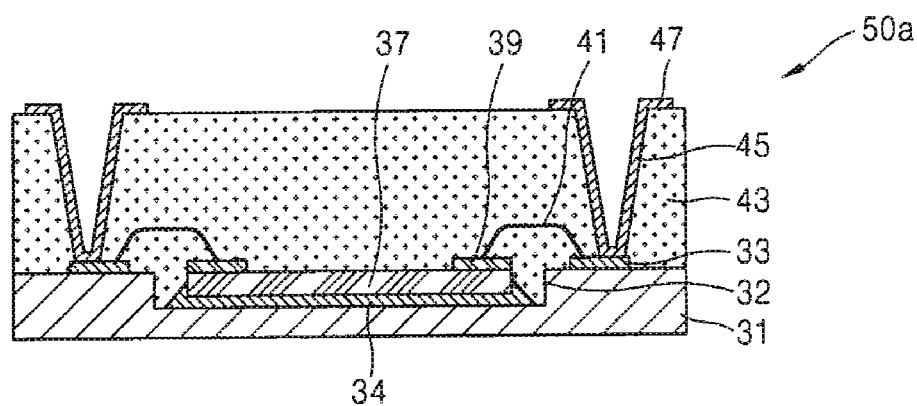
FIG. 6 is a cross-sectional view illustrating the structure of a chip-embedded interposer substrate according to another embodiment of the present invention.

FIG. 6 is a cross-sectional view illustrating the structure of a chip-embedded interposer substrate 50a according to another embodiment of the present invention.

Specifically, the structure and fabrication method of the chip embedded interposer substrate 50a of FIG. 6 are the same as those of FIG. 5, except that a cavity 32 is formed in a substrate 31, and a chip 37 is mounted in the cavity 32 with an adhesive layer 34 interposed therebetween. Since the chip 37 is mounted in the cavity 32 in the chip-embedded interposer substrate 50a of FIG. 6, the chip 37 can be more stably mounted, and a packaging process can be more stably performed. The chip-embedded interposer substrate 50a of FIG. 6 has the same advantages as the aforementioned chip embedded interposer substrate 50 described in FIGS. 1 through 5.

Semiconductor Package

Hereinafter, a process of fabricating semiconductor packages (60 and 90 of FIGS. 8 and 11) using the chip embedded interposer substrates 50 and 50a and the structures of the semiconductor packages will be described. For convenience of illustration, a process of fabricating semiconductor packages (60 and 90 of FIGS. 8 and 11) using the chip embedded interposer substrate 50 of FIG. 3 and the structures of the semiconductor packages will be described.

In the present invention, the key point is to connect chip pads to redistribution pads for redistributing the chip pads through bonding wires. Descriptions of the aforementioned chip-embedded interposer substrates 50 and 50a are identically applied to the following structure and fabrication process of a semiconductor package. Descriptions overlapping with the aforementioned embodiment will be omitted for convenience of illustration. Hereinafter, considering the concept of the present invention, a chip 37 refers to an "embedded chip", and a chip pad 39 of the embedded chip 37 refers to an "embedded chip pad".

Figure 7:
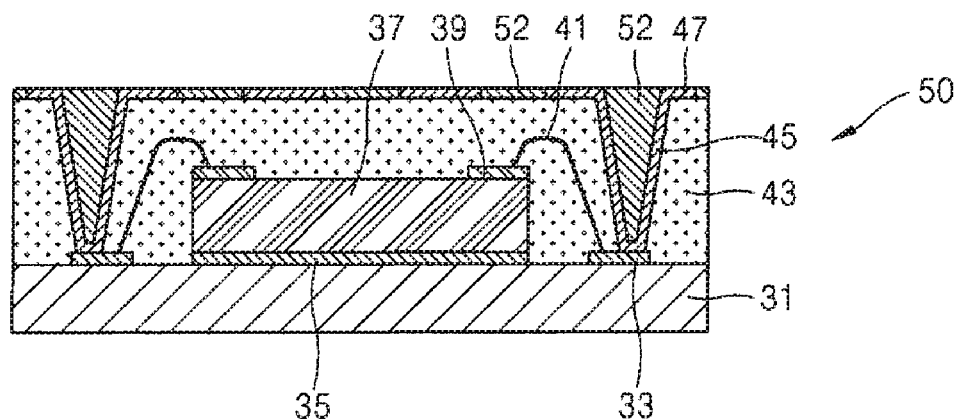
FIGS. 7 and 8 are cross-sectional views illustrating the structure and fabrication method of semiconductor packages using chip-embedded interposer substrates, respectively, according to other embodiments of the present invention.
Figure 8:
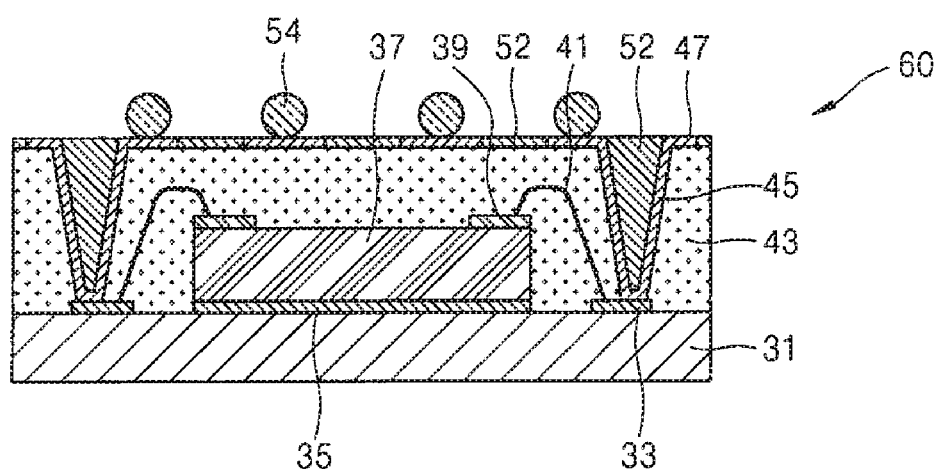

FIGS. 7 and 8 are cross-sectional views illustrating the structure and fabrication method of semiconductor packages using chip-embedded interposer substrates 50 and 60, respectively, according to other embodiments of the present invention.

Referring to FIG. 7, a chip embedded interposer substrate 50 is fabricated as described with reference to FIGS. 1 through 5. However, vias 47 of the chip embedded interposer substrate 50 of FIG. 7 are formed on both sidewalls of via holes 45, retribution interconnection pads 33 and a surface of a protective layer 43. In particular, the vias 47 are formed in the shape of a pattern on the surface of the protective layer 43 formed on an embedded chip 37.

Subsequently, an insulating layer 52 is formed in the via holes 45 and between the vias 47 formed in the shape of a pattern on the surface of the protective layer 43 formed on the embedded chip 37. The insulating layer 52 is formed of a solder resist layer.

Referring to FIG. 8, external connection terminals 54 are formed on the vias 47. The external connection terminals 54 are formed to be connected to the vias 47. The external connection terminals 54 are formed on a top surface of the protective layer 43 formed on the embedded chip 37. As such, a semiconductor package 60 is simply manufactured using the chip embedded interposer substrate 50.

Figure 9:
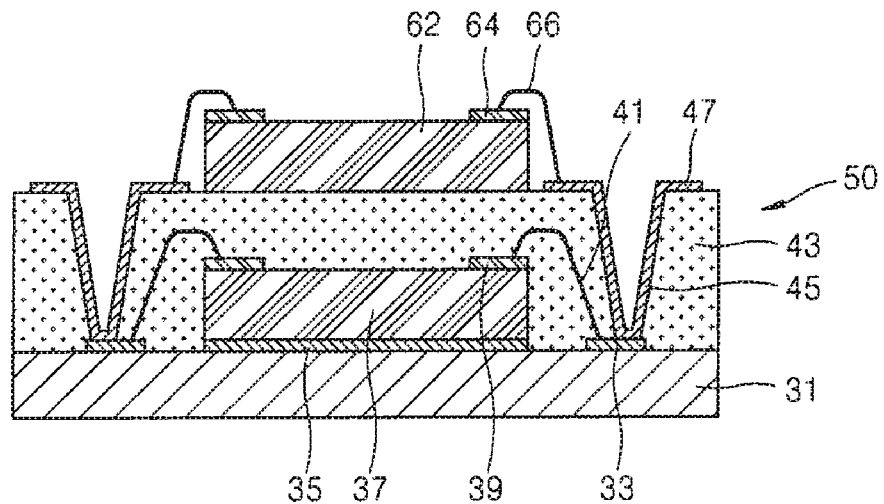
FIGS. 9 through 11 are cross-sectional views illustrating the structure and fabrication method of a semiconductor package using a chip-embedded interposer substrate according to another embodiment of the present invention.
Figure 10:
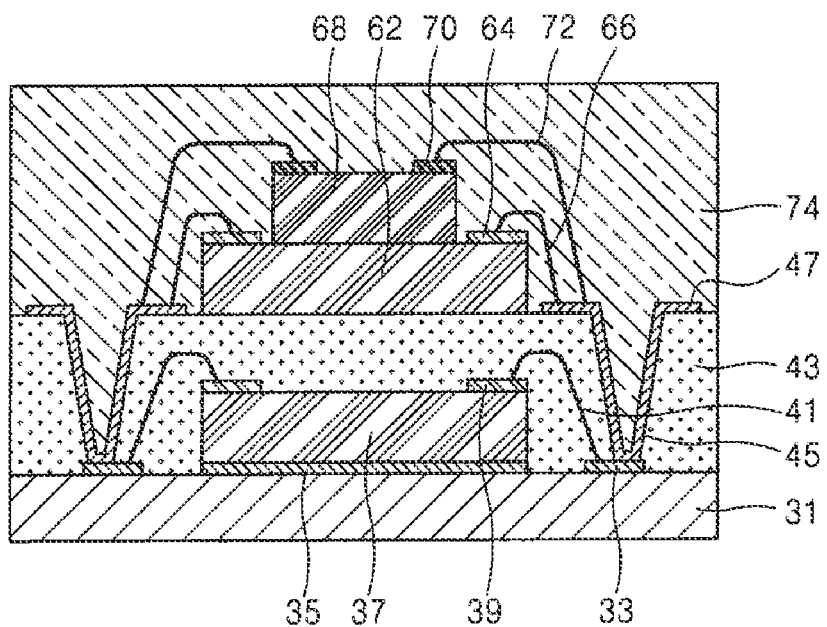
Figure 11:
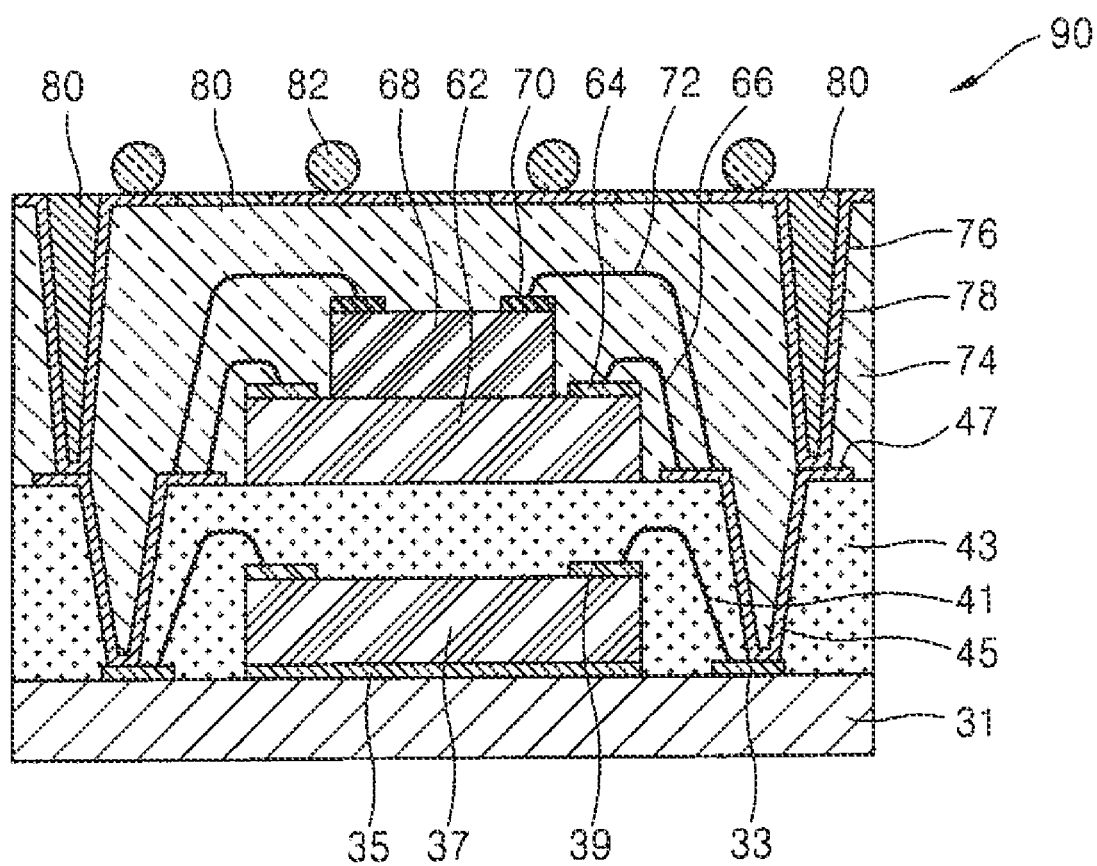

FIGS. 9 through 11 are cross-sectional views illustrating the structure and fabrication method of a semiconductor package using a chip-embedded interposer substrate 50, according to another embodiment of the present invention.

Specifically, FIGS. 9 through 11 illustrate a stacked semiconductor package including a plurality of chips stacked together using a chip embedded interposer substrate 50. Referring to FIGS. 9 through 11, two chips are stacked together for convenience of illustration. However, the number of chips may be increased, or only one chip may be stacked.

Referring to FIG. 9, the chip embedded interposer substrate 50 is fabricated as described above. That is, in the chip embedded interposer substrate 50, an embedded chip 37 (the aforementioned chip) including a plurality of embedded chip pads 39 (the aforementioned chip pads) is mounted on a substrate 31. The substrate 31 includes a plurality of redistribution pads 33 for the embedded chip pads 39.

The embedded chip pads 39 and the redistribution pads 33 are connected through first bonding wires 41. A first protective layer 43 having first via holes 45 for exposing the redistribution pads 33 is formed to bury the embedded chip 37 on the substrate 31. The first protective layer 43 may be formed of a resin material. First vias 47 connected to the redistribution pads 33 through the first via holes 45 are formed on both side walls of the first via holes 45, the redistribution pads 33 and a top surface of the first protective layer 43. The first vias 47 may be formed by coating and patterning a metallic material such as copper, gold or tungsten.

Subsequently, a first chip 62 is mounted on the first protective layer 43 with an adhesive layer (not shown) interposed therebetween. The first chip 62 may be a memory chip, a non-memory chip, a logic chip or an analog chip. In FIG. 9, the size of the first chip 62 is the same as that of the embedded chip 37, but the present invention is not limited thereto. The first chip 62 also includes a plurality of first chip pads 64. The first chip pads 64 and the first vias 47 are connected through second bonding wires 66.

Referring to FIG. 10, a second chip 68 is mounted on the first chip 62 with an adhesive layer (not shown) interposed therebetween. The second chip 68 may be a memory chip, a non-memory chip, a logic chip or an analog chip. In FIG. 10, the size of the second chip 68 is smaller than that of the first chip 62, but the present invention is not limited thereto. That is, the second chip 68 may be larger than the first chip 62. The second chip 68 also includes a plurality of second chip pads 70. The second chip pads 70 and the first vias 47 are connected through third bonding wires 72. Subsequently, a second protective layer 74 is formed to entirely bury the first and second chips 62 and 68. The second protective layer 74 may be formed of a resin material.

Referring to FIG. 11, second via holes 76 for exposing the first vias 47 are formed by etching the second protective layer 47. Second vias 78 are formed to be connected to the first vias 47 through the second via holes 76. The first via 78 may be formed by coating and patterning a metallic material such as copper, gold or tungsten. Subsequently, an insulating layer 80 is formed in the second via holes 76 and between the second vias 78 formed in the shape of a pattern on the surface of the second protective layer 74. The insulating layer 80 may be formed of a solder resist material.

Thereafter, external connection terminals 82 are formed to be connected to the second vias 78. The external connection terminals 82 are connected to the first vias 47 through the second vias 78. The external connection terminals 82 include solder balls. The external connection terminals 82 are formed on a top surface of the second protective layer 74 formed on the second chip 68. As a result, a stacked semiconductor package having the first and second chips 62 and 68 stacked together is simply manufactured using the chip embedded interposer substrate 50.

As described above, a chip-embedded interposer substrate according to the present invention includes a chip embedded therein and a plurality of redistribution pads for redistributing a plurality of chip pads mounted on the top surface of the chip. In the chip-embedded interposer substrate according to the present invention, the redistribution pads are formed on a substrate to have a relatively large pitch, and vias connected to the redistribution pads having a relatively large pitch are also formed to have a relatively large pitch. Accordingly, in the chip-embedded interposer substrate according to the present invention, chip pads having a relatively small pitch and redistribution pads having a relatively large pitch can be easily and simply connected using a wire bonding process.

Further, according to the present invention, a semiconductor package can be simply fabricated using the chip-embedded interposer substrate.

Furthermore, according to the present invention, a stacked semiconductor package including a plurality of chips stacked together can be easily fabricated using the chip-embedded interposer substrate regardless of the sizes of the chips.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
    an embedded chip comprising a plurality of embedded chip pads;
    a substrate having the embedded chip mounted thereon and comprising a plurality of redistribution pads for redistributing the embedded chip pads;
    first bonding wires for connecting the embedded chip pads to the redistribution pads;
    a first protective layer formed to bury the embedded chip and the substrate, and comprising first via holes for exposing the redistribution pads;
    first vias connected to the redistribution pads through the first via holes;
    a first chip mounted on the first protective layer and comprising a plurality of first chip pads;
    second bonding wires for connecting the first chip pads to the first vias;
    a second protective layer formed to entirely bury the embedded chip and the first chip, and comprising second via holes for exposing the first vias;
    second vias connected to the first vias through the second via holes; and
    external connection terminals connected to the second vias.

2. The semiconductor package of claim 1, further comprising:
    a second chip mounted on the first chip and comprising a plurality of second chip pads; and
    third bonding wires for connecting the second chip pads to the first vias.

3. The semiconductor package of claim 1, wherein the second vias are formed on both sidewalls of the second via holes, the first vias and a surface of the second protective layer.

4. The semiconductor package of claim 3, wherein the external connection terminals are formed on the second protective layer formed on the first chip.

5. The semiconductor package of claim 1, wherein the first vias are interconnections for connecting the redistribution pads for redistributing the embedded chip pads to the first chip pads of the first chip.

6. The semiconductor package of claim 1, wherein the pitch of the redistribution pads is greater than that of the embedded chip pads.

7. The semiconductor package of claim 1, wherein the embedded chip is mounted in a cavity formed in the substrate.

8. The semiconductor package of claim 1, wherein the first bonding wires connect some of the embedded chip pads to the redistribution pads.

* * * * *